(12) United States Patent
Kodra

(10) Patent No.: US 6,226,663 B1
(45) Date of Patent: May 1, 2001

(54) METHOD AND APPARATUS FOR OVERFLOW DETECTION IN A DECIMATION FILTER

(75) Inventor: Gregg S Kodra, Austin, TX (US)

(73) Assignee: SigmaTel, Inc., Austin, TX (US)

(*) Notice: Subject to any disclaimer, the term of this patent is extended or adjusted under 35 U.S.C. 154(b) by 0 days.

(21) Appl. No.: 09/198,068

(22) Filed: Nov. 23, 1998

(51) Int. Cl.[7] .............................. G06F 7/38; G06F 17/17
(52) U.S. Cl. .................................. 708/552; 708/313
(58) Field of Search ................... 708/300, 306, 708/307, 313, 552, 553, 530, 525, 498; 341/143

(56) References Cited

U.S. PATENT DOCUMENTS

| 5,126,961 | * | 6/1992 | Garverick | 708/313 |
| 5,227,991 | * | 7/1993 | Lay | 708/306 |
| 5,798,717 | * | 8/1998 | Bakhmutsky et al. | 341/50 |
| 6,075,474 | * | 6/2000 | Gabet et al. | 341/143 |
| 6,112,220 | * | 8/2000 | Smith | 708/552 |
| 6,157,331 | * | 12/2000 | Liu et al. | 341/143 |

\* cited by examiner

*Primary Examiner*—Chuong Dinh Ngo
(74) *Attorney, Agent, or Firm*—Timothy W. Markison

(57) ABSTRACT

A method and apparatus for detecting an overflow in a data stream include processing that begins by monitoring content of a stream of data. As the content of the stream of data is being monitored, the processing provides a word length signal that has a rate corresponding to a word rate of the stream of data. When the content of the stream of data is in a first logic state for an interval between the word length signal and a previous word length signal, the processing provides an overflow indication.

13 Claims, 3 Drawing Sheets

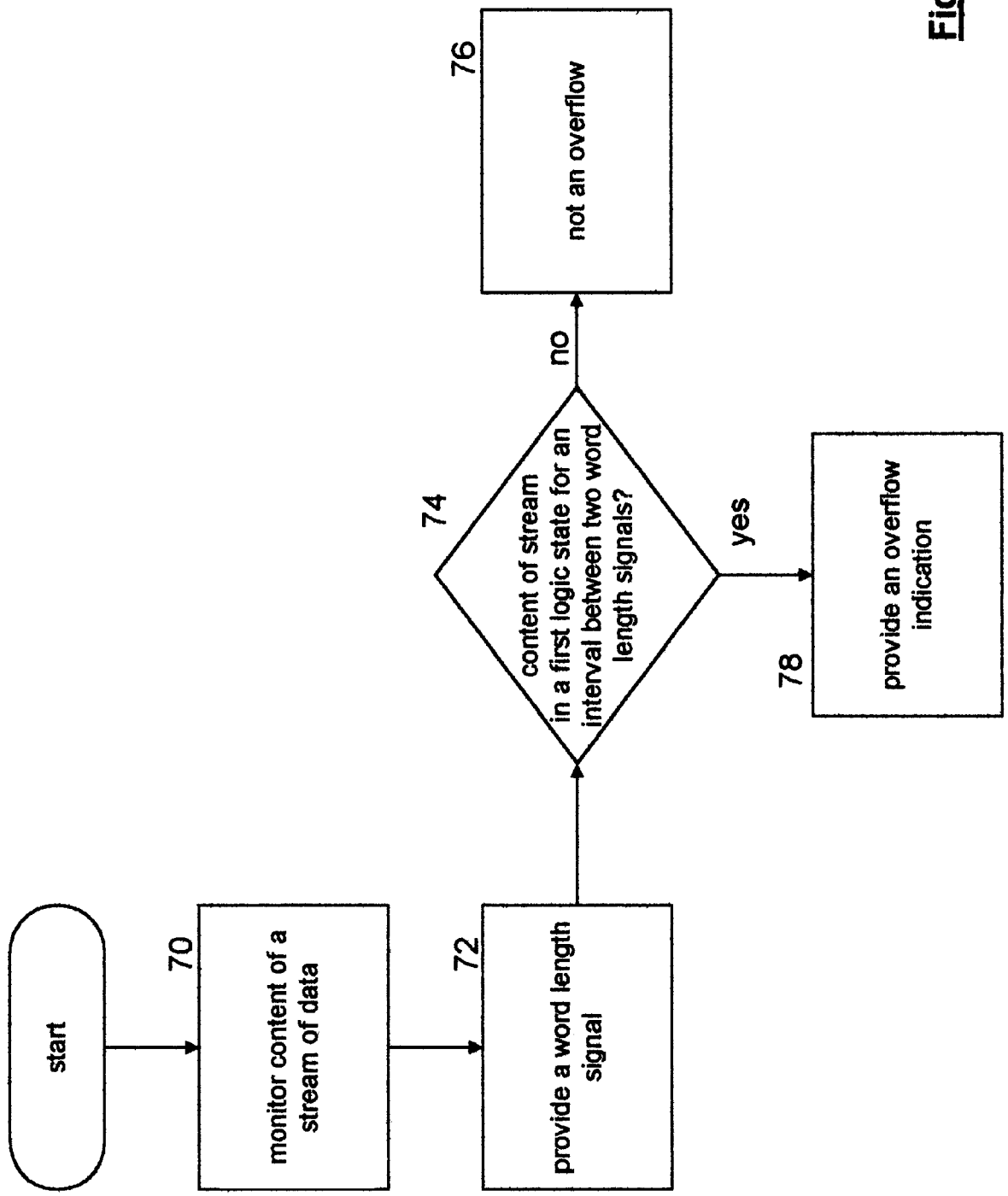

METHOD AND APPARATUS FOR OVERFLOW DETECTION IN A DECIMATION FILTER

TECHNICAL FIELD OF THE INVENTION

The present invention relates to Sigma-Delta analog to digital converters and more particularly to overflow detection in a decimation filter of the Sigma-Delta analog to digital converter.

BACKGROUND OF THE INVENTION

Sigma-Delta Analog-to-Digital Converters (ADC) are known to receive an analog input signal, sample it by a 1-bit Sigma-Delta modulator at a sampling rate, and pass the sampled signals through a decimation filter to obtain a digital signal. As is also known, the decimation filter includes an integrator, a sample and hold circuit, and a differentiator. The integrator is operably coupled to receive the sampled analog signals at a rate that is a multiple of the sampling rate. For example, the integrator's clock rate may be 64, 128, or 256 times the sampling rate of the 1-bit Sigma-Delta modulator. As the integrator receives the sampled signals, it integrates them. The sample and hold circuit receives the integrated signals, samples and holds them at a rate corresponding to a data word rate. The differentiator is operably coupled to receive signals outputted by the sample and hold circuit and differentiates them at the data word rate.

By including the decimation filter in the ADC, noise is reduced in lower frequency range (i.e., the range of interest for audio equipment) and effectively shifted to higher frequencies. A low pass filter is then used to attenuate the noise in the higher frequencies. The amount of noise reduction in the lower frequency range is dependent on the order of the decimation filter and the sampling rate. As the order of the decimation filter increases, the noise in the lower frequency range decreases, but the noise in the higher frequencies is greater. The noise is also reduced in the lower frequency range by increasing the sampling rate of the Sigma-Delta modulator. Thus, a balance between the sampling rate and order of the decimation filter may be obtained to produce the desired noise rejection.

If the decimation filter is a second order filter, it is inherently stable, which simplifies the compensation circuitry in comparison to higher order filters. A second order decimation filter, however, may saturate at the positive or negative rail when it is filtering a maximum positive or negative value. If the filter saturates, the resulting output is corrupted, which would cause audible errors in most audio equipment. To overcome the saturation problem, a decimation filter may include saturation logic. The saturation logic includes a saturation detection module and a saturation correction module. The saturation detection module is operably coupled to the input of the differentiator, while the saturation correction module is coupled to the output of the differentiator. If the saturation detection module detects a saturation condition, it sets a saturation bit, The saturation correction module interprets the saturation bit and it corrects the output when the bit is set. For example, when the decimation filter processes data as two's complement data, the maximum negative value is a bit difference than the maximum positive value, with respect to the binary numbering system (e.g., 1000 represents −8, while 0111 represents +7, for a four bit system).

While the above saturation detection and correction modules correct an overflow condition, they require a relatively large amount of circuitry to implement, in the order of 1 gate per bit of the digital word. As is known, the more gates a circuit requires, the more die area it requires, thus increasing the cost of manufacture, and the sales price of an Analog to Digital Converter.

Therefore, a need exists for a method and apparatus that provides overflow detection in decimation filters with a minimal number of extra gates.

BRIEF DESCRIPTION OF THE DRAWINGS

FIG. 3 illustrates a logic diagram for providing overflow detection in accordance with the present invention.

DETAILED DESCRIPTION OF A PREFERRED EMBODIMENT

Generally, the present invention provides a method and apparatus for detecting an overflow in a data stream. Such processing begins by monitoring content of a stream of data. As the content of the stream of data is being monitored, the processing provides a word length signal that has a rate corresponding to a word rate of the stream of data. When the content of the stream of data is in a first logic state for an interval between the word length signal and a previous word length signal, the processing provides an overflow indication. With such a method and apparatus, a minimal component overflow detection circuit may be implemented in an Analog to Digital Converter, thereby avoiding saturation of a decimation filter and the resulting adverse audio effects.

Figure 1:
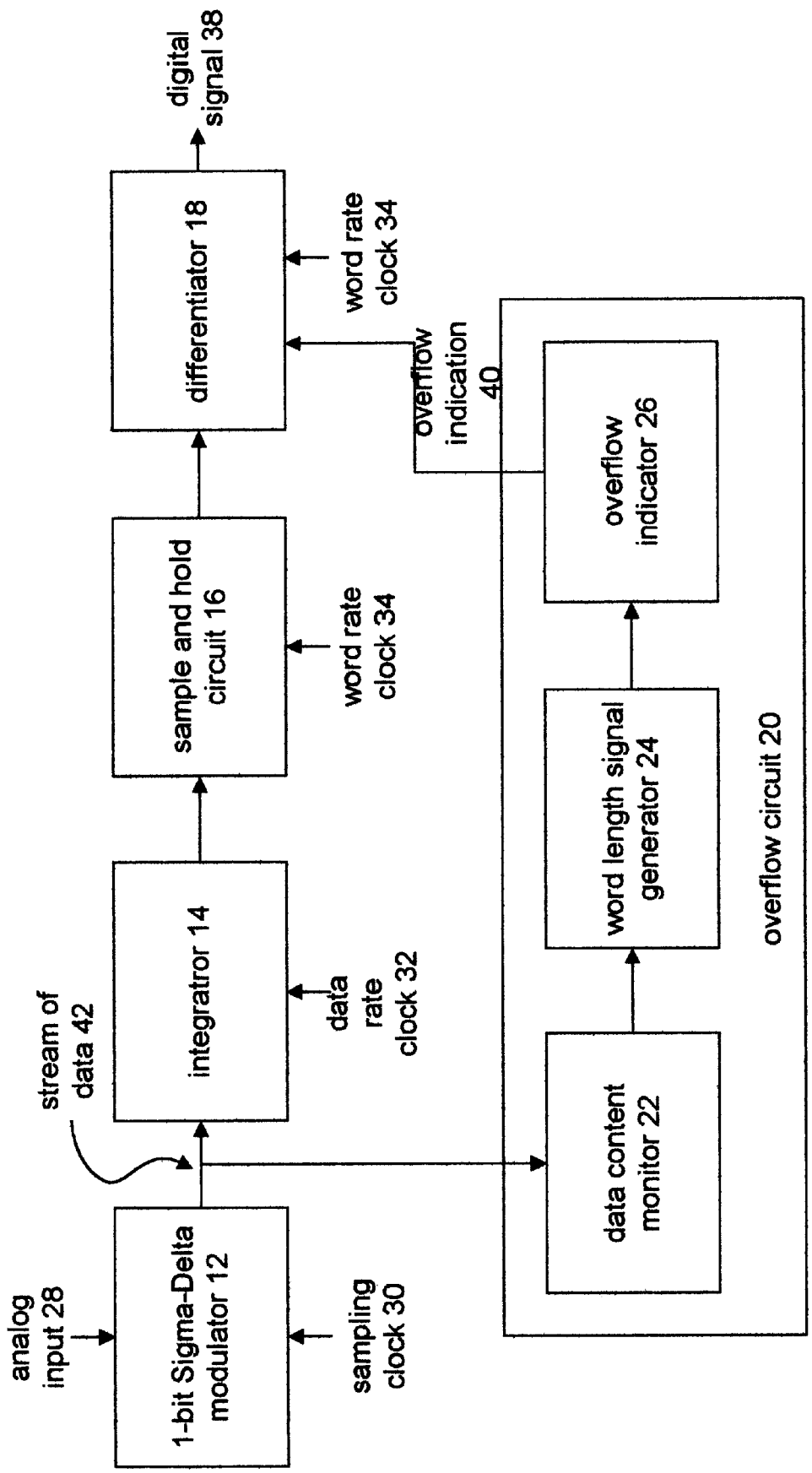
FIG. 1 illustrates a schematic block diagram of an Analog-to-Digital Converter in accordance with the present invention.

The present invention can be more fully described with reference to FIGS. 1–3. FIG. 1 illustrates a schematic block diagram of an Analog-to-Digital Converter (ADC) 10 that includes a 1-bit Sigma-Delta modulator 12, an integrator 14, a sample and hold circuit 16, a differentiator 18, and an overflow detection circuit 20. The overflow detection circuit 20 includes a data content monitor 22, a word length signal generator 24, and an overflow indicator 26.

The 1-bit Sigma-Delta modulator 12 is operably coupled to receive an analog input 28 and produce a stream of data 42, therefrom. The 1-bit Sigma-Delta modulator 12 is further operably coupled to receive a sampling clock signal 30, which has a rate of 100 KHz to 20 MHz. The 1-bit Sigma-Delta modulator 12 outputs a logic 1 or a logic 0 signal at each interval of the sampling clock. When the analog input 28 in near a maximum positive value, the modulator's 12 output will be a pulse train of almost all 1's. When the analog input 28 in near a maximum negative value, the modulator's output will be a pulse train of almost all 0's. When the analog input 28 is a value approximately half way between the maximum positive and negative values, the modulator's 12 output will be a pulse train of about fifty percent 1's and fifty percent 0's.

The integrator 14 receives the stream of data 42 at a data rate clock 32, which is a multiple of the sampling clock 30. For example, the data rate clock 32 may be 32, 64, 128, or 256 times that of the sampling clock 30. The integrator 14 integrates the stream of data 42 at the data rate clock 32 to produce integrated signals. The sample and hold circuit 16 receives the integrated signals and samples and holds the received integrated signals at a word rate clock 34, which is a divided representation of the data rate clock 32 based on the number of bits in a word. For example, if a data word includes thirty-two bits, the word rate clock 34 may be 1/32 of the data rate clock 32.

The differentiator 18 is operably coupled to receive the sampled and held signal for circuit 16 and to receive an overflow indication 40 from the overflow circuit 20. The differentiator 18 differentiates the received inputs at the word rate clock 34 to produce the digital signal output 38. The overflow indication 40 will be 0 as long as the stream of data 42 does not contain the maximum value for a full data word. When the overflow indication 40 is 0, it has no effect on the resulting digital output 38. But, when the stream of data 42 represents a maximum positive value for a given data word, the modulator's 12 output will be 1000 0000 . . . 0000, which, in two's compliment, is not reflective of the maximum positive value, but of the maximum negative value. Thus, an overflow condition arises.

The overflow circuit 20 is designed with minimal gates to detect the overflow and provide a carry bit (i.e., the overflow indication 40) to the differentiator 18. Upon receiving the overflow indication 40 for a maximum value, the differentiator 18 adjusts the received sampled and held signal, such that it is processed as a maximum positive value. To set the overflow indicator 40, the data content monitor 22 monitors the content of the stream of data 42. If the content of the stream of data 42 is in a first state for the duration of a data word, the overflow indicator 26 sets the overflow indicator 40. For example, if the stream of data 42, for a given word, includes all 1's, the overflow indication 40 will be set. Note that the overflow indicator 26 receives a word length signal from the word length signal generator 24 to provide data word delineation information.

Figure 2:
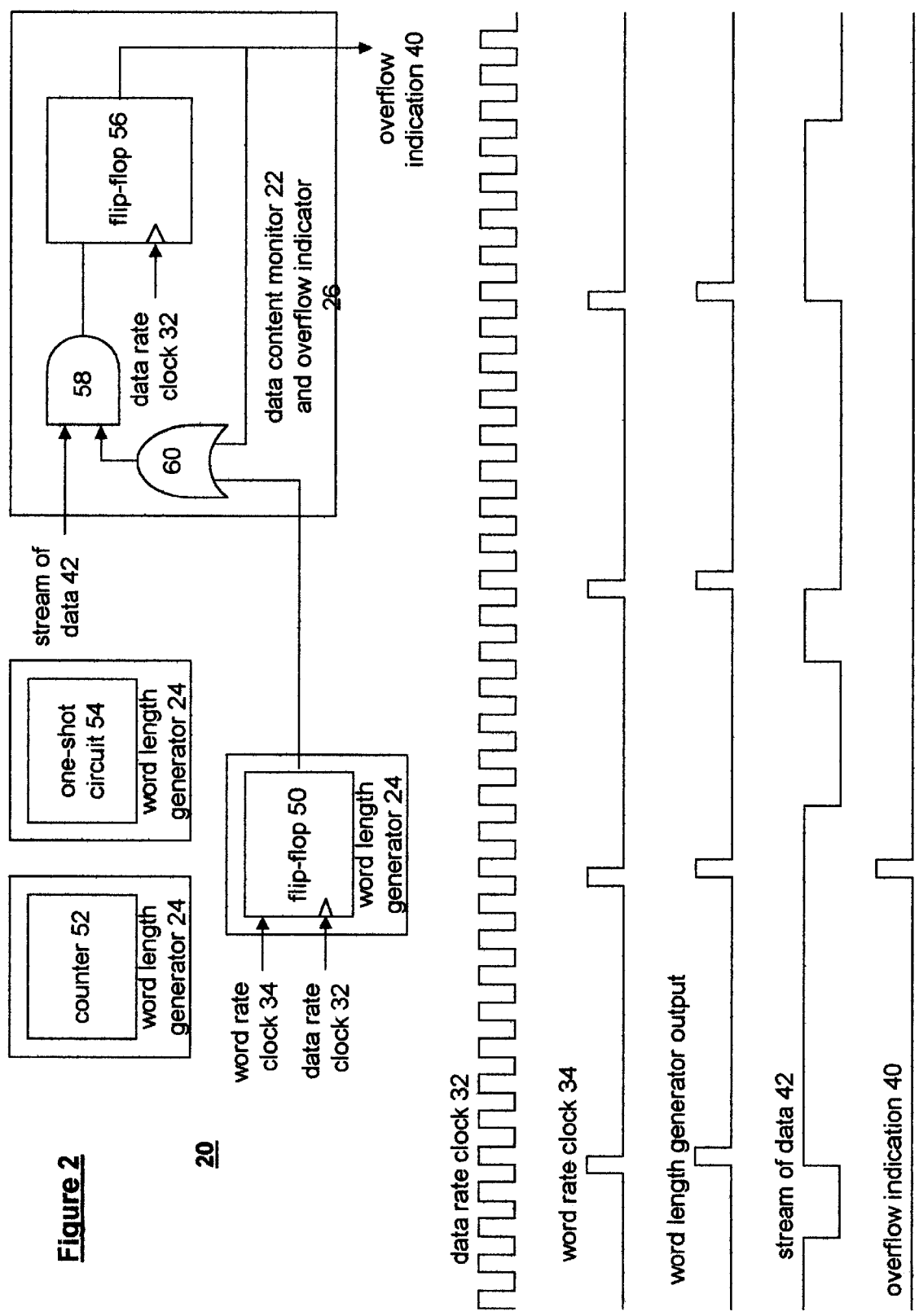
FIG. 2 illustrates a schematic block diagram of the overflow circuit of FIG. 1.

FIG. 2 illustrates a schematic block diagram of the overflow circuit 20, which includes the word length generator 24, the data content monitor 22, and the overflow indicator 26. As shown, the word length generator 24 is clocked by the data rate clock 32 and has an input of the word rate clock 34 and may be implemented as a flip flop 50, a counter 52, and/or a one-shot circuit 54. In any embodiment, the word length generator 24 outputs a pulse in sync with the word rate clock 34, which is shown as the third line in the timing diagram. The first and second lines of the timing diagram illustrate the data rate clock 32 and the word rate clock 34, respectively.

The data content monitor 22 and the overflow indicator 26 include an AND gate 58, an OR gate 60, and a flip-flop 56. In operation, if the stream of data 42 includes all 1's for the duration of a data word (i.e., the duration between two consecutive word length generator output signals), the overflow indicator 40 will be set (i.e., logic 1). This occurs because the first data rate clock interval of a data word, the inputs to the AND gate 58 are both a logic 1, which is clocked into the flip-flop 56. As such, the output of flip-flop 56, for the first interval, is logic 1, which is feed to an input of the OR gate 60. With the output of the flip-flop 56 in a logic 1, it will remain in that state until the stream of data 42 includes a zero. If the output of the flip-flop 56 is in the logic 1 state when the word rate clock 34 transitions, the differentiator 18 receives a set overflow indicator 40, and processes it accordingly. This is illustrated in the first interval of the timing diagram.

The stream of data 42 transitions to a logic 0 state during the second interval of the timing diagram. At the data rate clock 32, the overflow indication 40 will transition to a logic 0, since the output of the AND gate 58 is logic 0 (as a result of the stream of data 42 containing a 0) which causes the output of flip-flop 56 to be logic 0. The output of flip-flop 56 will remain a logic 0 (as will the overflow indicator 40) until the stream of data 42 and the word length indicator output each includes a logic 1 signal, at a transition edge of the data rate clock 32. When this occurs, the output of flip-flop 56 becomes logic 1 until the stream of data 42 transitions low. This is illustrated in the third and fourth intervals of the timing diagram. Thus, an overflow detection circuit may be implemented with 4 gates, an AND gate, an OR gate, and two flip-flops, which is considerably fewer gates than in previous overflow detection circuits.

FIG. 3 illustrates a logic diagram of a method for detecting an overflow condition in a stream of data. The process begins at step 70 where a stream of data is received and its contents are monitored. The stream may be received in a serial manner and includes data have a first logic state and a second logic state (e.g., logic 1, logic 0). The data may be formatted in two's complement to facilitate processing. The process then proceeds to step 72 where a word length signal is provided. The word length signal is based on the sampling rate of the data stream and is used to delineate a data word.

The process then proceeds to step 74 where a determination is made as to whether the content of the stream of data remained in a first stated for the duration of a data word, i.e., for the duration between two consecutive word length signals. If yes, the process proceeds to step 78, where an overflow indication is set, i.e., is provided. If not, the process proceeds to step 76, where the overflow indication is not set. The process continues for each data word of the data stream, until the data stream no longer includes valid data.

The preceding discussion has provided a method and apparatus for detecting an overflow condition in a data stream, where the apparatus can be implement with a minimal number of gates. By reducing the number of gates, the cost to implement an overflow circuit is reduce, since less components are needed, especially when implemented in a decimation filter of an Analog to Digital Converter.

What is claimed is:

1. A method for data stream overflow detection, the method comprises the steps of:
    a) monitoring content of a stream of data;
    b) providing a word length signal, wherein the word length signal has a rate corresponding to a word rate of the stream of data; and
    c) providing an overflow indication when the content of the stream of data was in a first logic state for an interval between the word length signal and a previous word length signal.

2. The method of claim 1, wherein the stream of data is received serially.

3. The method of claim 2, wherein the stream of data is formatted as two's complement data.

4. The method of claim 1, wherein step (a) further comprises monitoring the stream of data for at least one data bit having a second logic state.

5. The method of claim 1, wherein step (b) further comprises generating the word length signal based on a sampling rate of the stream of data.

6. A data stream overflow detection circuit comprises:
    a data content monitor operably coupled to receive a stream of data, to monitor content of the stream of data, and to provide an indication of the content;
    a word length signal generator that generates a word length signal that has a rate corresponding to a word rate of the stream of data; and
    an overflow indicator operably coupled to receive the word length signal and the indication of the content, wherein the overflow indicator generates an overflow indication when the indication of the content indicates that the content was in a first state for an interval between the word length signal and a previous word length signal.

7. The data stream overflow detection circuit of claim 6, wherein the word length generator comprises a flip-flop that includes an input, an output, and a clock input, wherein the clock input is coupled to receive a data clock signal, the input is coupled to receive a word clock signal, and the output provides the word length signal.

8. The data stream overflow detection circuit of claim 6, wherein the word length generator comprises at least one of: a one-shot circuit and a counter.

9. The data stream overflow detection circuit of claim 6, wherein the data content monitor comprises logic circuitry operably coupled to receive the word length signal, to serially receive the stream of data, and to receive a data clock signal, wherein the logic circuitry generates a carry in signal when the word length signal sets the logic circuitry.

10. The data stream overflow detection circuit of claim 9, wherein the data content monitor comprises an AND gate, a flip-flop, and an OR gate, wherein the AND gate is operably coupled to receive the stream of data and an output of the OR gate, wherein the OR gate is operably coupled to receive an output of the flip-flop and the word length signal, and wherein the flip-flop is operably coupled to receive an output of the AND gate and the data clock signal.

11. A decimation filter for use in an analog to digital converter, the decimation filter comprises:
   an integrator operably coupled to serially receive a stream of data, wherein the stream of data is received at a data rate;
   a sample and hold circuit operably coupled to an output of the integrator, wherein the sample and hold circuit samples the output of the integrator at a word rate, wherein the word rate is based on the data rate;
   a differentiator operably coupled to the output of the sample and hold circuit, wherein the differentiator generates a digital signal based on the output of the sample and hold circuit, and
   an overflow circuit operably coupled to the integrator and the differentiator, wherein the overflow circuit includes:
      a data content monitor operably coupled to receive the stream of data, to monitor content of the stream of data, and to provide an indication of the content;
      a word length signal generator that generates a word length signal that has a rate corresponding to the word rate; and
      an overflow indicator operably coupled to receive the word length signal and the indication of the content, wherein the overflow indicator generates an overflow indication when the indication of the content indicates that the content was in a first state for an interval between the word length signal and a previous word length signal, and wherein the overflow indicator provides the overflow indication to the differentiator.

12. The decimation filter of claim 11, wherein the word length generator comprises at least one of: a flip-flop, a one-shot circuit, and a counter.

13. The decimation filter of claim 11, wherein the data content monitor comprises logic circuitry operably coupled to receive the word length signal, to serially receive the stream of data, and to receive a data clock signal, wherein the logic circuitry generates a carry in signal when the word length signal sets the logic circuitry.

* * * * *